United States Patent
Hayashi et al.

(10) Patent No.: US 10,960,656 B2
(45) Date of Patent: Mar. 30, 2021

(54) NEGATIVELY-WORKING LITHOGRAPHIC PRINTING PLATE PRECURSOR AND METHOD

(71) Applicant: Eastman Kodak Company, Rochester, NY (US)

(72) Inventors: Koji Hayashi, Tatebayashi (JP); James Russell Matz, Fairport, NY (US); Satoshi Ishii, Oura-gun (JP); Yoshiaki Sekiguchi, Kumagaya (JP); Masamichi Kamiya, Oura-gun (JP)

(73) Assignee: EASTMAN KODAK COMPANY, Rochester, NY (US)

( * ) Notice: Subject to any disclaimer, the term of this patent is extended or adjusted under 35 U.S.C. 154(b) by 120 days.

(21) Appl. No.: 16/043,496

(22) Filed: Jul. 24, 2018

(65) Prior Publication Data

US 2018/0326714 A1    Nov. 15, 2018

Related U.S. Application Data

(63) Continuation-in-part of application No. 15/088,173, filed on Apr. 1, 2016, now abandoned.

(51) Int. Cl.
*G03F 7/32* (2006.01)
*B41C 1/10* (2006.01)
*G03F 7/027* (2006.01)
*G03F 7/004* (2006.01)

(52) U.S. Cl.
CPC .......... *B41C 1/1016* (2013.01); *B41C 1/1008* (2013.01); *G03F 7/0045* (2013.01); *G03F 7/027* (2013.01); *B41C 2210/04* (2013.01); *B41C 2210/22* (2013.01); *B41C 2210/24* (2013.01)

(58) Field of Classification Search
CPC ........................................................ G03F 7/30
See application file for complete search history.

(56) References Cited

U.S. PATENT DOCUMENTS

| | | | |
|---|---|---|---|
| 6,623,910 B2 | 9/2003 | Shimada et al. | |
| 6,908,727 B2 | 6/2005 | Shimada et al. | |
| 7,189,494 B2 | 3/2007 | Knight et al. | |
| 7,368,215 B2 | 5/2008 | Munnelly et al. | |
| 7,524,614 B2 | 4/2009 | Tao et al. | |
| 7,622,241 B2* | 11/2009 | Munnelly | B41C 1/1008 430/270.1 |
| 7,862,984 B2 | 1/2011 | Hayashi et al. | |
| 8,900,798 B2 | 12/2014 | Savariar-Hauck et al. | |
| 9,029,063 B2 | 5/2015 | Balbinot et al. | |
| 2004/0101280 A1 | 5/2004 | Tobiishi | |
| 2006/0269873 A1 | 11/2006 | Knight et al. | |
| 2007/0275322 A1* | 11/2007 | Tao | B41C 1/1008 430/270.1 |

FOREIGN PATENT DOCUMENTS

| | | |
|---|---|---|
| JP | 2002-116539 | 4/2002 |
| JP | 2007-007905 | 1/2007 |
| JP | 2007-062051 | 3/2007 |
| JP | 2008-107758 | 5/2008 |

* cited by examiner

*Primary Examiner* — Chanceity N Robinson
(74) *Attorney, Agent, or Firm* — J. Lanny Tucker

(57) ABSTRACT

A negative-working infrared radiation-sensitive lithographic printing plate precursor can be imaged and developed on-press to provide a lithographic printing plate. Such precursor has an initiator composition that contains compound A of Structure (I) and one or more compounds collectively as compound B of Structure (II) or Structure (III):

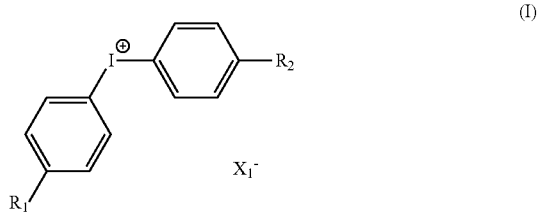

(I)

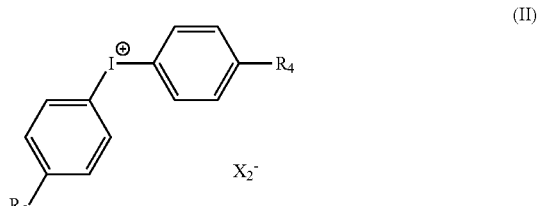

(II)

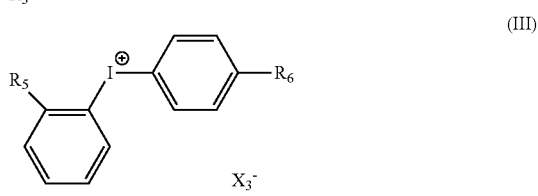

(III)

wherein $R_1$, $R_2$, $R_3$, $R_4$, $R_5$ and $R_6$ are independently alkyl groups each having 3 to 6 carbon atoms; at least one of $R_3$ and $R_4$ is different from $R_1$ or $R_2$; the difference of total number of carbon atoms in $R_1$ and $R_2$ and the total number of carbon atoms in $R_3$ and $R_4$ is 0, 1, or 2; the difference of total number of carbon atoms in $R_1$ and $R_2$ and the total number of carbon atoms in $R_5$ and $R_6$ is 0, 1, or 2; and $X_1$, $X_2$ and $X_3$ are the same or different anions.

9 Claims, No Drawings

NEGATIVELY-WORKING LITHOGRAPHIC PRINTING PLATE PRECURSOR AND METHOD

CROSS-REFERENCE TO RELATED APPLICATIONS

This application is a Continuation-in-part of U.S. Ser. No. 15/088,173, filed Apr. 1, 2016, (now abandoned) which claims the benefit of U.S. Provisional Patent Application No. 62/287,927, filed Jan. 28, 2016, both of which are incorporated herein by reference in their entirety.

FIELD OF THE INVENTION

This invention relates to a negative-working lithographic printing plate precursor that is sensitive to and imageable by infrared radiation. This precursor comprises an imageable layer comprising a unique combination of two or more different iodonium salts in an initiator composition. After imagewise exposure, the precursor can be processed (developed) either off-press using a suitable developer or on-press using a lithographic printing ink, fountain solution, or both.

BACKGROUND OF THE INVENTION

In lithographic printing, ink receptive regions, known as image areas, are generated on a hydrophilic surface. When the surface is moistened with water and a lithographic printing ink is applied, the hydrophilic regions retain the water and repel the lithographic printing ink, and the lithographic printing ink receptive regions accept the lithographic printing ink and repel the water. The lithographic printing ink is transferred to the surface of a material upon which the image is to be reproduced.

Imageable elements (lithographic printing plate precursors) useful to prepare lithographic printing plates typically comprise one or more radiation-sensitive imageable layers disposed over the hydrophilic surface of a substrate. Such radiation-sensitive imageable layers include one or more radiation-sensitive components that can be dispersed in a suitable binder or that act as the binder itself. After the imageable elements are imagewise exposed to suitable radiation to form exposed and non-exposed regions, either the exposed regions or the non-exposed regions of the imageable layer(s) are removed by a suitable developer, revealing the underlying hydrophilic surface of the substrate. If the exposed regions are removed, the imageable element is considered as positive-working. Conversely, if the non-exposed regions are removed, the imageable element is considered as negative-working. In each instance, the regions of the imageable layer (that are not removed by a developer) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The lithographic printing plate precursors for the preparation of infrared radiation-sensitive lithographic printing plates can be exposed using thermal heads of more usually, infrared laser diodes that image in response to signals from a digital copy of the image in a computer a platesetter. This "computer-to-plate" technology has generally replaced the former technology where masking films were used to image the precursors.

Infrared radiation-sensitive photopolymerizable compositions used in negative-working lithographic printing plate precursors typically comprise polymerizable compounds, one or more infrared radiation absorbers, one or more free radical initiators, and binder polymers. Among various useful free radical initiators desired for such precursors, diaryl iodonium salts are among the most effective. In recent years, there has been a desire in the lithographic printing industry for simplification of the printing plate making process including the omission of a pre-development heating step (preheat). There has also been a desire to provide development on press ("DOP") using a lithographic printing ink or fountain solution, or both to remove unwanted imageable layer materials on the exposed lithographic printing plate precursors.

Due to potential risks for printing press contamination, lithographic printing plate precursors designed for DOP application usually have no oxygen barrier layer that is common in other precursors or if such oxygen barrier layer is present, it is at a low coverage. Such precursor designs demand special free radical initiators such as diaryl iodonium salts having tetraphenyl borate anions (as shown for example, in U.S. Patent Application Publication 2006/0269873 of Knight et al.) that are even more efficient than conventional diaryl iodonium salts, and high initiator concentrations in the photopolymerizable composition.

One problem with such high efficiency free radical initiators being used at high concentration is the formation of crystals from the free radical initiators such that they are no longer in molecular contact with other components of the photopolymerizable composition in the imageable layer, resulting in lower crosslinking density during infrared radiation exposure. An attempt to minimize crystal formation was carried out using diaryl iodonium salts having long flexible chains attached to the aryl groups, but such attempts were found to provide insufficient free radical formation efficiency during exposure to infrared radiation.

U.S. Pat. No. 6,908,727 (Shimada et al.) describes the optional use of two or more iodonium salts in photopolymerizable compositions for lithographic printing plate precursors. As illustrated in the comparative examples described below, such iodonium mixtures still show severe tendency to crystal in the photopolymerizable compositions. U.S. Pat. No. 6,623,910 (Shimada et al.) also describes similar iodonium salts having multivalent anions.

There remains a need to provide negative-working lithographic printing plate precursors, especially those developable on-press, in which crystal formation is avoided or greatly reduced.

SUMMARY OF THE INVENTION

The problems noted above are addressed by the present invention with a negative-working, infrared radiation-sensitive lithographic printing plate precursor comprising:

a substrate having a hydrophilic surface, and an infrared radiation-sensitive imageable layer that is disposed on the hydrophilic surface of the substrate, and comprises:

one or more free radically polymerizable compounds;
one or more infrared radiation absorbers;
an initiator composition that provides free radicals upon exposure of the infrared radiation-sensitive imageable layer to infrared radiation, the initiator composition comprising compound A represented by the following Structure (I) and, one or more compounds collectively as compound B that are represented by the following Structure (II) or Structure (III); and
optionally, a primary polymeric binder,

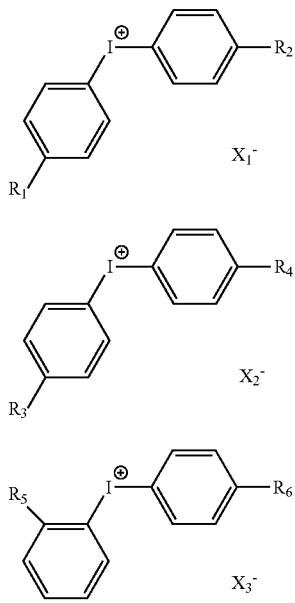

wherein:
$R_1$, $R_2$, $R_3$, $R_4$, $R_5$ and $R_6$ are independently substituted or unsubstituted alkyl groups each having 3 to 6 carbon atoms;
at least one of $R_3$ and $R_4$ is different from $R_1$ or $R_2$;
the difference between the total number of carbon atoms in $R_1$ and $R_2$ and the total number of carbon atoms in $R_3$ and $R_4$ is 0, 1, or 2;
the difference between the total number of carbon atoms in $R_1$ and $R_2$ and the total number of carbon atoms in $R_5$ and $R_6$ is 0, 1, or 2;
$X_1^-$, $X_2^-$ and $X_3^-$ are the same or different anions;
the molar ratio of compound A to compound B is from 20:80 to and including 80:20;
the sum of the weight of both compound A and compound B is at least 7 weight % and up to and including 15 weight %, based on the total dry weight of the infrared radiation-sensitive imageable layer; and at least one infrared radiation absorber is a cyanine dye.

In particular, a negative-working, infrared radiation-sensitive lithographic printing plate precursor according to the present invention that is on-press developable, comprises:
a substrate having a hydrophilic surface, and
an infrared radiation-sensitive imageable layer that is disposed on the hydrophilic surface of the substrate, and comprises:
one or more free radically polymerizable compounds;
one or more infrared radiation absorbers;
an initiator composition that provides free radicals upon exposure of the infrared radiation-sensitive imageable layer to infrared radiation, the initiator composition comprising compound A and one or more compounds collectively as compound B; and
optionally, a primary polymeric binder that is present in particulate form,
wherein:
Compound A includes one of the following cations, and each cation is present with a tetraphenyl borate anion:

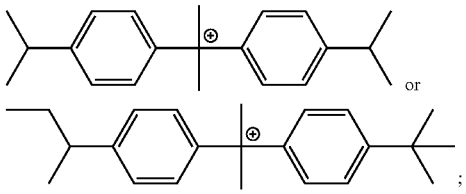

and
Compound B includes one of the following cations or mixture thereof, and each cation is present with a tetraphenyl borate anion:

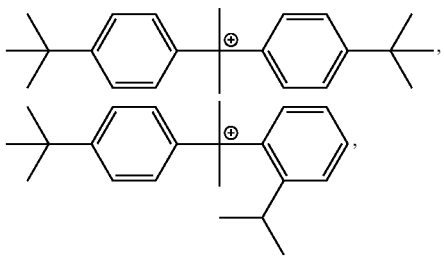

or a mixture of

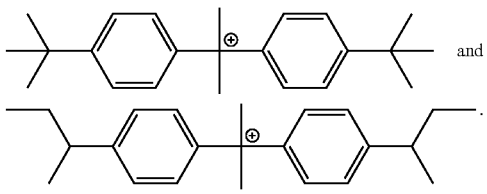

the molar ratio of compound A to compound B is from 20:80 to and including 80:20;
the sum of the weight of both compound A and compound B is at least 7 weight % and up to and including 15 weight %, based on the total dry weight of the infrared radiation-sensitive imageable layer; and
at least one infrared radiation absorber is a cyanine dye.

This invention also provides a method for providing a lithographic printing plate, the method comprising in sequence:
imagewise exposing the negative-working, infrared radiation-sensitive lithographic printing plate precursor of an embodiment described above to infrared radiation to provide an exposed precursor comprising exposed regions and non-exposed regions in the infrared radiation-sensitive imageable layer,
mounting the exposed precursor onto a lithographic printing press, and
removing the infrared radiation-sensitive imageable layer in the non-exposed regions using a lithographic ink, fountain solution, or both a lithographic ink and a fountain solution to provide a lithographic printing plate.

The present invention provides advantages with the use of a unique combination of similar but not identical iodonium salts. These advantages minimize the crystal formation described above by incorporation into the initiator composition of at least one Compound A and at least one Compound B, both of which are iodonium salts, as described herein.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described and the discussion of any embodiment.

Definitions

As used herein to define various components of the infrared radiation-sensitive imageable layer and formulation, unless otherwise indicated, the singular forms "a," "an," and "the," are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be given its conventional meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "negative-working, infrared radiation-sensitive lithographic printing plate precursor," "precursor," and "lithographic printing plate precursor" are meant to be equivalent references to embodiments of the present invention.

The term "support" is used herein to refer to an aluminum-containing material (web, sheet, foil, or other form) that can be then treated or coated to prepare a "substrate" that refers to a hydrophilic article having a hydrophilic surface upon which various layers, including the infrared radiation-sensitive imageable layer, and optional hydrophilic overcoat are coated.

As used herein, the term "infrared radiation absorber" refers to compounds or materials that are sensitive to wavelengths of infrared radiation.

As used herein, the term "infrared" refers to radiation having a Xmax of at least 750 nm and higher. In most instances, the term "infrared" is used to refer to the "near-infrared" region of the electromagnetic spectrum that is defined herein to be at least 750 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

As used herein, the term "polymer" is used to describe compounds with relatively large molecular weights formed by linking together many small reacted monomers. As the polymer chain grows, it folds back on itself in a random fashion to form coiled structures. With the choice of solvents, a polymer can become insoluble as the chain length grows and become polymeric particles dispersed in the solvent medium. These particle dispersions can be very stable and useful in infrared radiation-sensitive imageable layers described for use in the present invention. In this invention, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

The term "copolymer" refers to polymers composed of two or more different repeating or recurring units that are arranged along the polymer backbone.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

The term "arranged randomly" means that blocks of recurring units are not intentionally incorporated into the polymeric binders, but that recurring units are incorporated into the backbone in a random fashion using known polymerization procedures that do not encourage the formation of block copolymers.

Recurring units in polymeric binders described herein are generally derived from the corresponding ethylenically unsaturated polymerizable monomers used in a polymerization process, which ethylenically unsaturated polymerizable monomers can be obtained from various commercial sources or prepared using known chemical synthetic methods.

As used herein, the term "ethylenically unsaturated polymerizable monomer" refers to a compound comprising one or more ethylenically unsaturated (—C=C—) bonds that are polymerizable using free radical or acid-catalyzed polymerization reactions and conditions. It is not meant to refer to chemical compounds that have only unsaturated —C=C— bonds that are not polymerizable under these conditions.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

As used herein, the term "layer" or "coating" can consist of one disposed or applied layer or a combination of several sequentially disposed or applied layers. As the layer is considered infrared radiation-sensitive and negative-working, it is both sensitive to infrared radiation as described above and negative-working in the formation of lithographic printing plates.

Uses

The present invention is useful for preparing lithographic printing plates by imagewise exposing and processing the exposed precursor off-press using a suitable developer or on a suitable printing press using a lithographic printing ink, a fountain solution, or both a lithographic printing ink and a fountain solution as described below.

The lithographic printing plate precursors of the present invention are prepared with the structure and components described as follows.

Substrate

The substrate that is present in the precursors generally has a hydrophilic surface, or at least a surface that is more hydrophilic than the applied infrared radiation-sensitive imageable layer on the imaging side of the substrate. The substrate comprises a support that can be composed of any material that is conventionally used to prepare lithographic printing plate precursors.

One useful substrate is composed of an aluminum support that can be treated using techniques known in the art, including roughening of some type by physical (mechanical) graining, electrochemical graining, or chemical graining, usually followed by anodizing. Anodizing is typically done using phosphoric or sulfuric acid and conventional procedures.

Sulfuric acid anodization of the aluminum support generally provides an oxide weight (coverage) on the surface of at least 1.5 g/m$^2$ and up to and including 5 g/m$^2$ and more typically of at least 3 g/m$^2$ and up to and including 4.3 g/m$^2$. Phosphoric acid anodization generally provides an oxide weight on the surface of from at least 0.5 g/m$^2$ and up to and including 5 g/m$^2$ and more typically of at least 1 g/m$^2$ and up to and including 3 g/m$^2$.

Anodized aluminum support can be treated further to seal the oxide pores and to hydrophilize its surface using known post-anodic treatment (PAT) processes, such as treatments in aqueous solutions of poly(vinyl phosphonic acid) (PVPA), vinyl phosphonic acid copolymers, poly[(meth)acrylic acid], or acrylic acid copolymers, mixtures of phosphate and fluoride salts, or sodium silicate. Useful treatment processes include dipping with rinsing, dipping without rinsing, and various coating techniques such as extrusion coating.

A substrate can also comprise a grained and sulfuric acid anodized aluminum-containing support that has also been treated with an alkaline or acidic pore-widening solution to provide its outer surface with columnar pores so that the diameter of the columnar pores at their outermost surface is at least 90% of the average diameter of the columnar pores. This substrate can further comprise a hydrophilic layer disposed directly on a grained, sulfuric acid anodized and treated aluminum-containing support, and the hydrophilic layer comprises a non-crosslinked hydrophilic polymer having carboxylic acid side chains. Further details of such substrates and methods for providing them are provided in U.S. Patent Publication 2013/0052582 (Hayashi) the disclosure of which is incorporated herein by reference.

The thickness of a substrate can be varied but should be sufficient to sustain the wear from printing and thin enough to wrap around a printing form. Useful embodiments include a treated aluminum foil having a thickness of at least 100 μm and up to and including 700 μm. The backside (non-imaging side) of the substrate can be coated with antistatic agents, a slipping layer, or a matte layer to improve handling and "feel" of the precursor.

Infrared Radiation-Sensitive Imageable Layer

The precursors of the present invention can be formed by suitable application of a negative-working infrared radiation-sensitive composition as described below to a suitable substrate (as described above) to form an infrared radiation-sensitive imageable layer that is negative-working on that substrate. In general, the infrared radiation-sensitive composition (and resulting infrared radiation-sensitive imageable layer) comprises one or more free radically polymerizable compounds, one or more infrared radiation absorbers, an initiator composition that provides free radicals upon exposure to imaging infrared radiation, and a primary polymeric binder as the essential components, all of which essential components are described in more detail below. There is generally only a single infrared radiation-sensitive imageable layer in the precursor, and it is desirably on-press developable, meaning that after infrared radiation imaging, it can be developed on-press without the need for development using a separate developing composition. This single infrared radiation-sensitive imageable layer is generally the outermost layer in the precursor, but in some embodiments, there can be an outermost water-soluble hydrophilic overcoat (also known as a topcoat or oxygen barrier layer) disposed over the one or more infrared radiation-sensitive imageable layers.

The infrared radiation-sensitive imageable layers provided in precursors can optionally include one or more primary polymeric binders that can be selected from a number of materials known in the art, and are generally different from the free radically polymerizable compounds described below. For example, some useful primary polymeric binders comprise recurring units having side chains comprising polyalkylene oxide segments such as those described in U.S. Pat. No. 6,899,994 (Huang et al.) the disclosure of which is incorporated herein by reference. Other useful primary polymeric binders comprise two or more types of recurring units having different side chains comprising polyalkylene oxide segments as described in Japanese Patent Publication 2015-202586 (Kamiya et al.). Some of such primary polymeric binders can further comprise recurring units having pendant cyano groups as those described in U.S. Pat. No. 7,261,998 (Hayashi et al.) the disclosure of which is incorporated herein by reference.

Some useful primary polymeric binders are present in particulate form, that is, in the form of discrete particles (non-agglomerated particles). Such discrete particles can have an average particle size of at least 10 nm and up to and including 1500 nm, or typically of at least 80 nm and up to and including 600 nm, and that are generally distributed uniformly within the infrared radiation-sensitive imageable layer. Average particle size can be determined by various known methods including measuring the particles in electron scanning microscope images, and averaging a set number of measurements.

In some embodiments, the primary polymeric binder is present in the form of particles having an average particle size that is less than the average dry thickness (t) of the infrared radiation-sensitive imageable layer. The average dry thickness (t) in micrometers (μm) is calculated by the following Equation:

$$t = w/r$$

wherein w is the dry coating coverage of the infrared radiation-sensitive imageable layer in g/m$^2$ and r is 1 g/cm$^3$. For example, in such embodiments, the primary polymeric binder can comprise at least 0.05% and up to and including 80%, or more likely at least 10% and up to and including 50%, of the average dry thickness (t) of the infrared radiation-sensitive imageable layer.

The primary polymeric binders also can have a backbone comprising multiple (at least two) urethane moieties as well as pendant groups comprising the polyalkylenes oxide segments.

Useful primary polymeric binders also include those that comprise polymerizable groups such as acrylate ester group, methacrylate ester group, vinyl aryl group and allyl group and those that comprise alkali soluble groups such as carboxylic acid. Some of these useful primary binders are described in U.S. Patent Application Publication 2015/0099229 (Simpson et al.) and U.S. Pat. No. 6,916,595 (Fujimaki et al.), the disclosures of both of which are incorporated herein by reference.

Primary polymeric binders generally have a weight average molecular weight ($M_n$) of at least 2,000 and up to and including 500,000, or at least 20,000 and up to and including 300,000, as determined by Gel Permeation Chromatography (polystyrene standard).

Useful primary polymeric binders can be obtained from various commercial sources or they can be prepared using known procedures and starting materials, as described for example in publications described above.

The total primary polymeric binders are generally present in the infrared radiation-sensitive imageable layer in an amount of at least 10 weight % and up to and including 70 weight %, or more likely in an amount of at least 20 weight % and up to and including 50 weight %, based on the total dry weight of the infrared radiation-sensitive imageable layer.

The infrared radiation-sensitive composition (and infrared radiation-sensitive imageable layer) comprises one or more free radically polymerizable compounds, each of which contains one or more free radically polymerizable groups (and two or more of such groups in some embodiments) that can be polymerized using free radical initiation. In some embodiments, the infrared radiation-sensitive imageable layer comprises two or more free radically polymerizable components having different numbers of free radically polymerizable groups in each molecule. In general, this free radically polymerizable compounds are different than the primary polymeric binders described above. However, in some embodiments, the free radically polymerizable compounds can have chemical composition and molecular weight so that they also behave as a "polymeric binder".

Useful free radically polymerizable components can contain one or more free radical polymerizable monomers or oligomers having one or more addition polymerizable ethylenically unsaturated groups (for example, two or more of such groups). Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable components include urea urethane (meth)acrylates or urethane (meth)acrylates having multiple (two or more) polymerizable groups. Mixtures of such compounds can be used, each compound having two or more unsaturated polymerizable groups, and some of the compounds having three, four, or more unsaturated polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) the disclosures of all of which are incorporated herein by reference. Other useful free radically polymerizable components include those described in U.S. Patent Application Publication 2009/0142695 (Baumann et al.), which radically polymerizable components include 1H-tetrazole groups, and the disclosure of which is incorporated herein by reference.

The one or more free radically polymerizable compounds are generally present in an infrared radiation-sensitive imageable layer in an amount of at least 10 weight % and up to and including 70 weight %, or typically of at least 20 weight % and up to and including 50 weight %, all based on the total solids in the noted layer.

In addition, the infrared radiation-sensitive composition (and imageable layer) also comprises one or more infrared radiation absorbers to provide desired radiation sensitivity. The total amount of one or more infrared radiation absorbers is at least 0.5 weight % and up to and including 30 weight %, or typically of at least 1 weight % and up to and including 15 weight %, based on the infrared radiation-sensitive composition (or imageable layer) total solids.

Some useful infrared radiation absorbers are sensitive to both infrared radiation (typically of at least 700 nm and up to and including 1400 nm) and visible radiation (typically of at least 450 nm and up to and including 700 nm). Useful infrared radiation absorbers are described in U.S. Pat. No. 7,429,445 (Munnelly et al.) the disclosure of which is incorporated herein by reference.

In many embodiments of this invention, the present invention comprises one or more infrared radiation absorbers that are sensitive only to near-infrared or infrared radiation having a wavelength of at least 750 nm. Such useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyrylo-arylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (Furukawa), U.S. Pat. No. 6,787,281 (Tao et al.), U.S. Pat. No. 7,018,775 (Tao), U.S. Pat. No. 7,135,271 (Kawaushi et al.), WO 2004/101280 (Munnelly et al.), and EP 1,182,033A2 (noted above), the disclosures of all of which are incorporated herein by reference. In some embodiments, it is desirable that at least one infrared radiation absorber in the infrared radiation-sensitive imageable layer be a cyanine dye, and in some embodiments, a cyanine dye comprising a tetraarylborate anion such as a tetraphenylborate anion.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

The infrared radiation-sensitive imageable layer also includes an initiator composition that comprises a compound A and one or more compounds collectively known as compound B described below in order to achieve the advantages described above. These essential compounds are individually and collectively capable of generating free radicals sufficient to initiate polymerization of the various free radically polymerizable compounds described above upon exposure to imaging infrared radiation. Thus, the initiator composition is generally responsive, for example, to electromagnetic radiation of at least 750 nm and up to and including 1400 nm or at least 750 nm and up to and including 1250 nm. The initiator composition can be used for any of the noted infrared radiation exposures or for multiple infrared radiation exposures.

Compound A is represented by Structure (I) shown below, and the one or more compounds collectively known as compound B are represented below by either Structure (II) or (III):

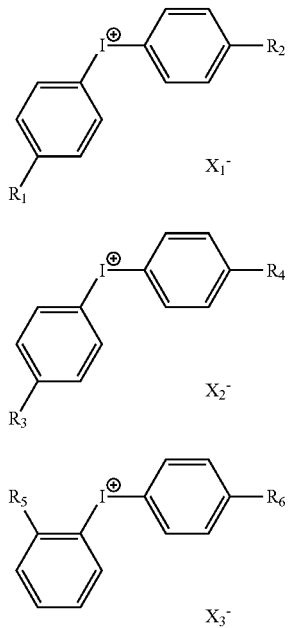

In these Structures (I), (II), and (III), $R_1$, $R_2$, $R_3$, $R_4$, $R_5$ and $R_6$ are independently substituted or unsubstituted alkyl groups or substituted or unsubstituted alkoxy groups, each of these alkyl or alkoxy groups having from 2 to 9 carbon atoms (or particularly alkyl groups independently having from 3 to 6 carbon atoms). These alkyl and alkoxy groups can have linear or branched form. Thus, various isomers are also useful. Some particularly useful substituted or unsubstituted alkyl groups include but are not limited to, ethyl, n-propyl, iso-propyl, n-butyl, iso-butyl, sec-butyl, t-butyl, n-pentyl, t-pentyl, sec-pentyl, neopentyl, n-hexyl, iso-hexyl, sec-hexyl, t-hexyl, n-heptyl, n-octyl, iso-octyl, 2-ethyl hexyl, and n-nonyl groups. Useful substituted or unsubstituted alkoxy groups include but are not limited to, ethoxy, n-propoxy, iso-propoxy, t-butoxy, n-butoxy, and n-octyloxy groups.

In many useful embodiments, $R_1$, $R_2$, $R_3$, $R_4$, $R_5$ and $R_6$ are independently substituted or unsubstituted alkyl groups, such as independently chosen substituted or unsubstituted alkyl groups having 3 to 6 carbon atoms, or each having 3 to 5 carbon atoms.

Other essential features of Structures (I), (II), and (III), include:
at least one of $R_3$ and $R_4$ is different from $R_1$ or $R_2$;
the difference between the total number of carbon atoms in $R_1$ and $R_2$ and the total number of carbon atoms in $R_3$ and $R_4$ is 0 to 4 (that is, 0, 1, 2, 3, or 4), and particularly, this difference is 0, 1, or 2, or even more particularly, 2;
the difference between the total number (sum) of carbon atoms in $R_1$ and $R_2$ and the total number (sum) of carbon atoms in $R_5$ and $R_6$ is 0 to 4 (that is, 0, 1, 2, 3, or 4), and particularly, this difference is 0, 1, or 2, or even more particularly, 2; and
$X_1$, $X_2$ and $X_3$ are the same or different anions.

Useful anions include but are not limited to, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and borate anions represented by the following Structure (IV):

wherein $R^1$, $R^2$, $R^3$, and $R^4$ independently represent substituted or unsubstituted alkyl, substituted or unsubstituted aryl (including halogen-substituted aryl groups), substituted or unsubstituted alkenyl, substituted or unsubstituted alkynyl, substituted or unsubstituted cycloalkyl, or substituted or unsubstituted heterocyclic groups, or two or more of $R^1$, $R^2$, $R^3$, and $R^4$ can be joined together to form a substituted or unsubstituted heterocyclic ring with the boron atom, such rings having up to 7 carbon, nitrogen, oxygen, or nitrogen atoms. The optional substituents on $R^1$, $R^2$, $R^3$, and $R^4$ can include chloro, fluoro, nitro, alkyl, alkoxy, and acetoxy groups. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups. In many embodiments, at least one of $X_1$, $X_2$, and $X_3$ is a tetraarylborate anion comprising the same or different aryl groups, or in particularly useful embodiments, one or more is a tetraphenylborate anion or each of $X_1$, $X_2$, and $X_3$ is a tetraphenylborate anion.

It has been found that useful embodiments are lithographic printing plate precursors comprising an initiator composition wherein compound B comprises a compound that is represented by Structure (III), $R_1$ is the same as $R_5$, and $R_2$ is the same as $R_6$. In some of these embodiments, $R_1$ is the same as $R_2$, for example both $R_1$ and $R_2$ can be iso-propyl, iso-butyl, or t-butyl groups.

In other embodiments, compound B in the initiator composition comprises a compound that is represented by Structure (II), $R_1$ is the same as $R_2$, and $R_3$ is the same as $R_4$. For example, in such embodiments, both $R_1$ and $R_2$ can be iso-propyl, iso-butyl, or t-butyl groups. In such embodiments, the difference in the number of carbon atoms between $R_1$ and $R_3$ is 0, 1, or 2.

Mixtures of Compound B compounds represented by Structures (II) or (III) can be used if desired.

A skilled worker in the art could readily design a useful initiator composition with compound A and compound B using the teaching provided above, and representative examples of such compounds are provided in the working examples shown below. Many useful compounds represented by Structures (I), (II), and (III) can be obtained from commercial sources such as Sigma-Aldrich or they can be prepared using known synthetic methods and readily available starting materials.

For example, Compound A can include one of the following cations, and each cation can be present with a tetraphenyl borate anion:

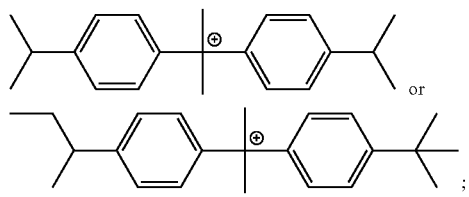

and

Compound B can include one of the following cations (or mixture thereof), and each cation can be present with a tetraphenyl borate anion:

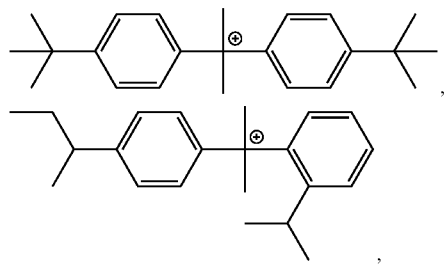

or a mixture of

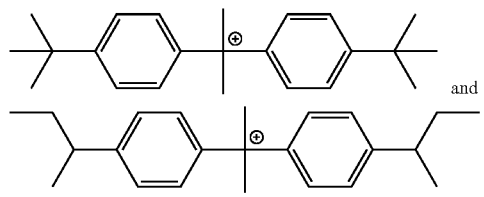

The initiator composition is present in the infrared radiation-sensitive imageable layer sufficient to provide a total (cumulative) amount of compound A and compound B of at least 3 weight % and up to and including 30 weight %, or typically of at least 5 weight % and up to and including 18 weight %, or even at least 7 weight % and up to and including 15 weight %, all based on the total solids in the infrared radiation-sensitive imageable layer.

In addition, the molar ratio of compound A to compound B is generally from 10:90 to and including 90:10, or more likely from 20:80 to and including 80:20, or from 30:70 to and including 70:30, or from 40:60 to and including 60:40.

While not essential to the present invention, the infrared radiation-sensitive imageable layer can also include one or more secondary polymeric binders (crosslinked or non-crosslinked) when a primary polymeric binder is present. Examples of such materials are known in the art and are described in the incorporated U.S. patents and patent application publications referenced above.

In some embodiments, the secondary polymeric binders are more hydrophilic than the primary polymeric binders. Example of such hydrophilic secondary polymeric binders include but are not limited to, cellulose derivatives such as hydroxypropyl cellulose, carboxymethyl cellulose, and polyvinyl alcohol with various degrees of saponification.

In some embodiments, such secondary polymeric binders are crosslinked hydrophobic materials as described for example in U.S. Pat. No. 9,417,524 (Savariar-Hauck et al.), the disclosure of which is incorporated herein by reference.

When present, secondary polymeric binders can be present in an amount of at least 1 weight % and up to and including 20 weight %, based on the total solids of the infrared radiation-sensitive imageable layer. The amount of the secondary polymeric binders is generally lower than that of the primary polymeric binders.

Additional additives to the infrared radiation-sensitive imageable layer can include dye precursors and color developers as are known in the art.

Useful dye precursors include but are not limited to, phthalide and fluoran leuco dyes having a lactone skeleton with an acid dissociation property, such as those described in U.S. Pat. No. 6,858,374 (Yanaka), the disclosure of which is incorporated herein by reference.

The infrared radiation-sensitive imageable layer can include crosslinked polymer particles having an average particle size of at least 3 μm and up to and including 20 μm as described for example in U.S. Ser. No. 14/642,876 (filed Mar. 10, 2015 by Hayakawa et al.) and in U.S. Pat. No. 8,383,319 (Huang et al.) and U.S. Pat. No. 8,105,751 (Endo et al), the disclosures of all of which are incorporated herein by reference.

The infrared radiation-sensitive imageable layer can also include a variety of other optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers, or combinations thereof, or any other addenda commonly used in the lithographic art, in conventional amounts. The infrared radiation-sensitive imageable layer can also include a phosphate (meth)acrylate having a molecular weight generally greater than 250 as described in U.S. Pat. No. 7,429,445 (Munnelly et al.) the disclosure of which is incorporated herein by reference.

Hydrophilic Overcoat

While in some embodiments of the present invention, the infrared radiation-sensitive imageable layer is the outermost layer with no layers disposed thereon, it is possible that the precursors could be designed with a hydrophilic overcoat (or oxygen-barrier layer or topcoat) disposed directly on the infrared radiation-sensitive imageable layer (no intermediate layers between these two layers).

When present, this hydrophilic overcoat is generally the outermost layer and thus, when stacked with other precursors, the hydrophilic overcoat of one precursor would be in contact with the backside of the substrate of the precursor immediately above it.

Such hydrophilic overcoats can comprise one or more film-forming water-soluble polymeric binders in an amount of at least 60 weight % and up to and including 98 weight %, based on the total dry weight of the hydrophilic overcoat. Such film-forming water-soluble (or hydrophilic) polymeric binders can include a modified or unmodified poly(vinyl alcohol) having a saponification degree of at least 30%, or a degree of at least 75%, or a degree of at least 90%, and a degree of up to and including 99.9%.

Further, one or more acid-modified poly(vinyl alcohol)s can be used as film-forming water-soluble (or hydrophilic) polymeric binders in the hydrophilic overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly(vinyl alcohol), carboxylic acid-modified poly(vinyl alcohol), and quaternary ammonium salt-modified poly(vinyl alcohol), glycol-modified poly(vinyl alcohol), or combinations thereof.

The optional hydrophilic overcoat can also include cross-linked polymer particles having an average particle size of at least 3 μm and up to and including 20 μm as described for example in U.S. Ser. No. 14/642,876 (filed Mar. 10, 2015 by Hayakawa et al.) and in U.S. Pat. No. 8,383,319 (Huang et al.) U.S. Pat. No. 8,105,751 (Endo et al), the disclosures of all of which are incorporated herein by reference.

When present, the hydrophilic overcoat is provided at a dry coating coverage of at least 0.1 g/m$^2$ and up to but less than 4 g/m$^2$, and typically at a dry coating coverage of at least 0.15 g/m$^2$ and up to and including 2.5 g/m$^2$. In some embodiments, the dry coating coverage is as low as 0.1 g/m$^2$ and up to and including 1.5 g/m$^2$ or at least 0.1 g/m$^2$ and up to and including 0.9 g/m$^2$, such that the hydrophilic overcoat layer is relatively thin for easy removal during off-press development or on-press development.

The hydrophilic overcoat can optionally comprise organic wax particles dispersed, generally uniformly, within the one or more film-forming water-soluble (or hydrophilic) polymeric binders as described for example in U.S. Patent Application Publication 2013/0323643 (Balbinot et al.), the disclosure of which is incorporated herein by reference.

Negative-Working Infrared Radiation-Sensitive Lithographic Printing Plate Precursors The negative-working infrared radiation-sensitive compositions described above can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. They can also be applied by spraying onto a suitable support. Typically, the negative-working infrared radiation-sensitive composition is applied and dried to form an infrared radiation-sensitive imageable layer that is on-press developable after imaging using infrared radiation.

Such manufacturing methods can include mixing the various components needed for the imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. After proper drying, the dry coating coverage of the infrared radiation-sensitive imageable layer is generally at least 0.1 g/m$^2$ and up to and including 4 g/m$^2$ or at least 0.4 g/m$^2$ and up to and including 1.8 g/m$^2$.

Distinct non-imageable layers can also be present under the infrared radiation-sensitive imageable layer and disposed directly on the hydrophilic substrate to enhance developability or to act as thermal insulating layers. However, unless a hydrophilic overcoat layer is present, there are no layers disposed over the infrared radiation-sensitive imageable layer.

As noted above, in some embodiments, a suitable aqueous-based hydrophilic overcoat formulation (as described above) can be applied to the dried infrared radiation-sensitive imageable layer in a suitable manner, and then dried in a suitable manner.

Imaging (Exposing) Conditions

During use, a negative-working infrared radiation-sensitive lithographic printing plate precursor of this invention can be exposed to a suitable source of exposing radiation depending upon the infrared radiation absorber present in the infrared radiation-sensitive imageable layer to provide specific sensitivity that is at a wavelength of at least 750 nm and up to and including 1400 nm, or of at least 800 nm and up to and including 1250 nm using an appropriate energy source.

For example, imaging can be carried out using imaging or exposing radiation from an infrared radiation-generating laser (or array of such lasers). Imaging also can be carried out using imaging radiation at multiple wavelengths at the same time if desired. The laser used to expose the precursor is usually a diode laser, because of the reliability and low maintenance of diode laser systems, but other lasers such as gas or solid-state lasers can also be used. The combination of power, intensity and exposure time for infrared radiation laser imaging would be readily apparent to one skilled in the art.

The imaging apparatus can be configured as a flatbed recorder or as a drum recorder, with the negative-working infrared radiation-sensitive lithographic printing plate precursor mounted to the interior or exterior cylindrical surface of the drum. Examples of useful imaging apparatus are available as models of KODAK® Trendsetter platesetters (Eastman Kodak Company) that contain laser diodes that emit near infrared radiation at a wavelength of about 830 nm. Other suitable imaging apparatus include the Screen PlateRite 4300 series or 8600 series platesetter (available from Screen USA, Chicago, Ill.) that operate at a wavelength of 808 nm and 830 nm, respectively.

Imaging with infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the infrared radiation-sensitive imageable layer.

Processing (Development) and Printing

After imagewise exposing, the exposed negative-working infrared radiation-sensitive lithographic printing plate precursors having exposed regions and non-exposed regions in the infrared radiation-sensitive imageable layer are processed in a suitable manner to remove the non-exposed regions (and any hydrophilic overcoat over such regions).

An imaged negative-working infrared radiation-sensitive lithographic printing plate precursor is mounted onto a printing press and the printing operation is begun. The non-exposed regions in the infrared radiation-sensitive imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

In a typical printing press startup with a sheet-fed printing machine, the dampening roller is engaged first and supplies fountain solution to the mounted imaged precursor to swell the exposed infrared radiation-sensitive imageable layer at least in the non-exposed regions. After a few revolutions, the inking rollers are engaged and they supply lithographic printing ink(s) to cover the entire printing surface of the lithographic printing plates. Typically, within 5 to 20 revolutions after the inking roller engagement, printing sheets are supplied to remove the non-exposed regions of the infrared radiation-sensitive imageable layer as well as materials on a blanket cylinder if present, using the formed ink-fountain emulsion.

The following Examples are provided to illustrate the practice of this invention and are not meant to be limiting in any manner.

Negative-working, infrared radiation-sensitive lithographic printing plate precursors were prepared using a substrate that was composed of an aluminum sheet that had been subjected to an electrolytic roughening treatment in a hydrochloric acid solution to achieve an average roughness (Ra) of 0.4 μm. The aluminum sheet was then subjected to an anodizing treatment in an aqueous phosphoric acid solution to form 1.1 g/m² of an oxide film and then coated with a post-treatment aqueous solution of poly(acrylic acid) to give a dry thickness of 0.03 g/m².

Onto samples of this substrate, an infrared radiation-sensitive imageable layer for formed using a formulation shown in the following TABLE I. Each formulation comprised a specific combination of Compound A and Compound B shown in TABLE II below. Each formulation was coated onto the substrate using a bar coater, dried at 110° C. for 40 seconds, and then cooled to 35° C. to give a dry coating weight of 1.0 g/m² of the resulting infrared radiation-sensitive imageable layer, thus forming a negative-working, infrared radiation-sensitive lithographic printing plate precursor with each formulation.

TABLE I

Formulation for the IR-Sensitive Imageable Layer

| Component | Parts by Weight |
|---|---|
| Urethane Acrylate 1[1] | 1.50 |
| Graft copolymer 1[2] | 7.14 |
| Hydroxy propyl methyl cellulose[3] | 0.20 |
| Compound A | X (see TABLE II) |
| Compound B | Y (see TABLE II) |
| Acrylate ester 1[4] | 1.00 |
| IR dye 1[5] | 0.25 |
| BYK ® 336[6] | 0.05 |
| n-Propanol | 44.68 |
| Water | 22.34 |
| Methyl ethyl ketone | 22.34 |
| TOTAL | 100.00 |

[1]Urethane acrylate 1 is a reaction product of hexamethylene diisocyanate and di pentaerythritol pentaacrylate.
[2]Graft copolymer 1 is a 21 weight % dispersion of a copolymer derived from acrylonitrile, polyethylene glycol methyl ether methacrylate, and styrene at 70:10:20 ratio by weight in an 80/20 mixture of n-propanol/water, prepared according to a process as used for polymer A in U.S. Pat. No. 7,592,128 (bottom of Column 27).
[3]Hydroxy propyl methyl cellulose 1 is 30% of methoxylated, 10% hydroxyl propylated cellulose polymer, having a viscosity of 5 mPa second in a 2% aqueous solution at 20° C.
[4]Acrylate ester 1 is an ethoxylated pentaerythritol tetraacrylate having an average ethoxy chain length of 5.
[5]IR dye 1 is represented by the following formula:

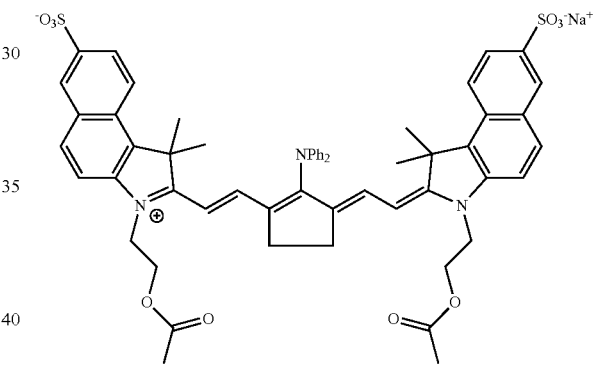

[6]BYK ® 336 is a modified dimethyl polysiloxane copolymer available from BYK Chemie (Wallingford, CT) in a 25% xylene/methoxypropyl acetate solution.

TABLE II

| | Compounds A and B | | | |
|---|---|---|---|---|
| | Compound A* | | Compound B* | |
| Precursor Example | Structure | Component X and Parts by Weight in TABLE I | Structure | Component Y and Parts by Weight in TABLE I |
| Example 1 | (structure) | 0.25 | (structure) | 0.25 |
| Example 2 | (structure) | 0.25 | (structure) | 0.25 |

TABLE II-continued

Compounds A and B

| | Compound A* | | Compound B* | |
| --- | --- | --- | --- | --- |
| Precursor Example | Structure | Component X and Parts by Weight in TABLE I | Structure | Component Y and Parts by Weight in TABLE I |
| Example 3 | [iodonium: 4-isopropylphenyl / 4-tert-butylphenyl] | 0.25 | [iodonium: bis(4-tert-butylphenyl)] and [iodonium: bis(4-sec-butylphenyl)] | 0.125 each |
| Comparative 1 | [iodonium: bis(4-tert-butylphenyl)] | 0.5 | | |
| Comparative 2 | [iodonium: bis(4-isopropylphenyl)] | 0.5 | | |
| Comparative 3 | [diphenyliodonium] | 0.5 | | |
| Comparative 4 | [iodonium: bis(4-R-phenyl)], R = C10–C13 alkyl | 0.5 | | |
| Comparative 5 | [iodonium: 2,4-dimethylphenyl / 2,4-dimethylphenyl] | 0.25 | [iodonium: 2,4-dimethylphenyl / 2,6-dimethylphenyl] | 0.25 |
| Comparative 6 | [iodonium: bis(4-tert-butylphenyl)] | 0.25 | [iodonium: bis(4-tert-butylphenyl)] $PF_6^-$ | 0.25 |
| Comparative 7 | [iodonium: bis(4-tert-butylphenyl)] | 0.25 | [diphenyliodonium] | 0.25 |
| Comparative 8 | [iodonium: bis(4-isopropylphenyl)] | 0.25 | [iodonium: 4-isobutylphenyl / 4-methylphenyl] $PF_6^-$ | 0.25 |
| Comparative 9 | [iodonium: bis(4-isopropylphenyl)] | 0.25 | [iodonium: bis(4-R-phenyl)], R = C10–C13 alkyl | 0.25 |

*Counterion is tetraphenyl borate except for Compound B of Comparative Example 6 and Compound B of Comparative 6 that had $PF_6^-$ as a counterion.

The negative-working, infrared radiation-sensitive lithographic printing plate precursors prepared in this manner were each imagewise exposed on a Kodak Magnus 800 image setter to deliver a dose of 150 mJ/cm² in a solid area and thus formed exposed precursors having both exposed areas and unexposed areas in the infrared radiation-sensitive imageable layer.

Each of the negative-working, infrared radiation-sensitive lithographic printing plate precursors was evaluated in the following manner.

Crystallization Test:

Each of the negative-working infrared radiation-sensitive lithographic printing plate precursors was scratched 3 times using an ethylene propylene diene terpolymer (EPDM) rubber sheet under the pressure of 318 kg/m² and aged 7 days at 40° C. and 80% relative humidity. After this aging process, each precursor was exposed to infrared radiation using the process described above to assess the level of damage in a solid exposed regions caused by crystal formation in the scratched area. The aged lithographic printing plate precursors were also examined using a KEYENCE VE-8800 scanning electron microscope (SEM) to check the amount of formed crystals. Ulvac-Phi TRIFT-II ToF-SIM analysis of the crystals revealed the presence of corresponding iodonium cation and tetraphenyl borate anion. The crystallization tendency was rated according to the level of damage in the solid area and the amount of crystals observed in the SEM images according to the following scale:

A: No damage of the solid exposed region caused by crystal formation and no crystals observed in SEM images;

B: Trace damage of the solid exposed region caused by crystal formation and very few crystals observed in SEM images;

C: Slight damage of the solid exposed region caused by crystal formation and crystals readily observed in the SEM images;

D: Moderate damage of the solid exposed region caused by crystal formation and numerous crystals observed in the SEM images; and E: Severe damage and numerous crystals observed in the SEM images.

On-Press Developability:

Each of the exposed lithographic printing plate precursors was mounted onto the plate cylinder of a Roland R-201 press machine without development. The printing press was operated with a fountain solution of Presarto WS100 (marketed by DIC Graphics)/isopropyl alcohol/water at a 1/1/98 volume ratio, and Fusion G Magenta N lithographic printing ink (marketed by DIC Graphics) at a printing rate of 9,000 sheets/hour. The plate cylinder was rotated for 10 revolutions with only the fountain solution supplied, and then for another 10 revolutions with both the fountain solution and the lithographic printing ink supplied before the printable papers were fed through. The on-press developability of each precursor was rated as follows by the number of printed paper sheets until the lithographic printing plate no longer transferred ink in the non-exposed regions.

A: Printing plate was developable on-press in the first impression (this is acceptable for customers);

B: Printing plate was developable on-press within five impressions; (this is acceptable for customers);

C: Printing plate was developable on-press within ten impressions (this was not acceptable for customers);

D: Printing plate was developable on-press within twenty impressions (this was not acceptable for customers); and E: Printing plate was not developable on-press (this was not acceptable for customers).

Printing Press Life:

Each of the exposed lithographic printing plate precursors was exposed as described above and mounted onto a Komori S-26 press machine. A fountain solution composed of Presarto WS100 (marketed by DIC Graphics)/isopropyl alcohol/water at a 1/1/98 volume ratio and Fusion G Magenta N lithographic printing ink (marketed by DIC Graphics) were supplied, and printing was performed at a printing rate of 9,000 sheets/hour. This printing test is performed up to 10,000 impressions. When the number of printed paper sheets was increased by continued printing, the exposed regions of the imageable layer of the lithographic printing plate was gradually worn away, and ink receptivity deteriorated. Thus, the ink density on the printed paper sheets was reduced. The printing press life was evaluated as shown below by the number of printed paper sheets when the ink density (reflective density) thereon was reduced to 90% or less of that when the printing was begun.

A: Press life was confirmed as of over 10,000 impressions;

B: Press life was confirmed at a range of at least 5,001 to 10,000 impressions;

C: Press life was confirmed at a range of at least 2,001 to 5,000 impressions;

D: Press life was confirmed at a range of at least 1,001 to 2,000 impressions; and E: Imageable layer coating was lost within 1,000 impressions.

The results of the evaluations from the three test are shown in the following TABLE III.

TABLE III

|  | Crystallization Test | Printing Press Life | On-Press Development |
|---|---|---|---|
| Example 1 | A | B | A |
| Example 2 | A | B | A |
| Example 3 | A | B | A |
| Comparative 1 | C | B | A |
| Comparative 2 | C | B | A |
| Comparative 3 | E | Unmeasurable; severe crystal formation | A |
| Comparative 4 | A | E | A |
| Comparative 5 | D | A | A |
| Comparative 6 | C | C | B |
| Comparative 7 | E | Unmeasurable due to severe crystallization | A |
| Comparative 8 | B | C | A |
| Comparative 9 | A | D | A |

The data in TABLE III show that negative-working infrared radiation-sensitive lithographic printing plate precursors of the present invention exhibited reduced formation of crystals (rating of "A") in the infrared radiation-sensitive imageable layer, excellent on-press developability (rating of "A"), and good press life (rating of "A" or "B").

The lithographic printing plate precursors according to Comparatives 1, 2, 3, and 4 all comprised a single iodonium salt. The precursors used in Comparatives 1, 2, and 3 exhibited undesirable crystal formation. Severe crystal formation was observed in Comparative 3 because the iodonium cation contained no alkyl substituents on its phenyl rings. The precursor used in Comparative 4 did not show crystal formation due to long flexible alkyl chains on the iodonium benzene rings but exhibited very poor printing press life.

The lithographic printing plate precursors according to Comparatives 5, 6, 7, 8 and 9 all comprised two iodonium salts, but these precursors failed in one or more of the evaluation tests. The iodonium salts used in Comparative 5 contained two substituents instead of one substituent on each of the iodonium benzenes and each substituent had only one carbon. The Comparative 5 precursor exhibited severe blooming. The Comparative 6 precursor contained an iodonium salt wherein at least one of $R_3$ and $R_4$ is not different from $R_1$ or $R_2$. The Comparative 6 precursor exhibited shorter printing press life and worse (unacceptable) crystal formation. In Comparatives 7 and 8, at least one of $R_1$, $R_2$, $R_3$ and $R_4$ has less than 2 carbons in the iodonium salts. The Comparative 7 and 8 precursors exhibited worse (unacceptable) crystallization. In the precursor of Comparative 9, at least one of $R_1$, $R_2$, $R_3$ and $R_4$ had more than 9 carbons. The Comparative 9 precursor did not exhibit crystallization, but it exhibited poor printing press life.

In Comparative Example 6, a combination of two diaryliodonium salts having the same cation but different anions, and thus outside the present invention, gave poor results in crystallization and printing press life test as shown in TABLE III. In Comparative Examples 7, 8, and 9, the Compound B did not have a $C_{3-6}$ alkyl group on each of the phenyl rings as required by the present invention. Due to the lack of this feature, the corresponding precursors of those comparative examples showed poor crystallization and/or poor press life. Compound B in Comparative Example 7 had no alkyl group. Compound B in Comparative Example 8 had a methyl group (less than 3 carbon atoms) on one of the phenyl ring. Compound B in Comparative Example 9 had an R group having 10 to 13 carbon atoms (more than 6 carbon atoms) on each of the two phenyl rings.

Further, the data in TABLE II show that Invention Examples 1-3 fall within the present invention and provided precursors that allow a user to experience reduced crystal formation while maintaining high printing press life (run length) and on-press developability.

The invention has been described in detail with particular reference to certain preferred embodiments thereof, but it will be understood that variations and modifications can be made within the spirit and scope of the invention.

The invention claimed is:

1. A negative-working, infrared radiation-sensitive lithographic printing plate precursor comprising:
   a substrate having a hydrophilic surface, and
   an infrared radiation-sensitive imageable layer that is disposed on the hydrophilic surface of the substrate, and comprises:
     one or more free radically polymerizable compounds;
     one or more infrared radiation absorbers;
     an initiator composition that provides free radicals upon exposure of the infrared radiation-sensitive imageable layer to infrared radiation, the initiator composition comprising compound A and, one or more compounds collectively as compound B; and
     optionally, a primary polymeric binder,
   the molar ratio of compound A to compound B is from 20:80 to and including 80:20;
   the sum of the weight of both compound A and compound B is at least 7 weight % and up to and including 15 weight %, based on the total dry weight of the infrared radiation-sensitive imageable layer; and
   at least one infrared radiation absorber is a cyanine dye, wherein Compound A includes one of the following cations, and each cation is present with a tetraphenyl borate anion:

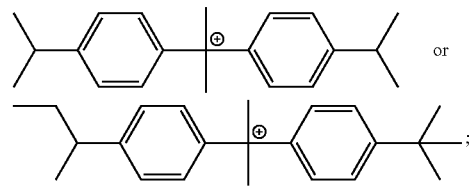

and Compound B includes one of the following cations or a mixture thereof, and each cation is present with a tetraphenyl borate anion:

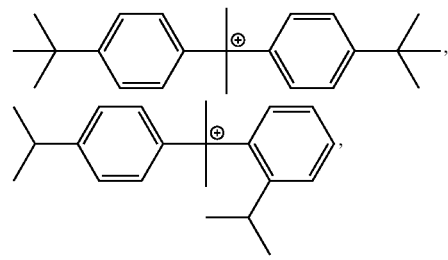

or a mixture of

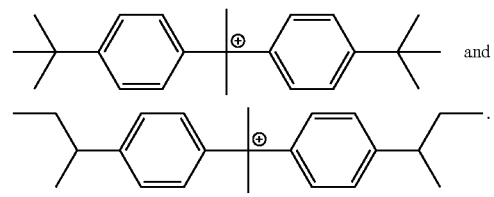

2. The negative-working, infrared radiation-sensitive lithographic printing plate precursor of claim 1, wherein at least one infrared radiation absorber is a cyanine dye comprising a tetraarylborate anion.

3. The negative-working, infrared radiation-sensitive lithographic printing plate precursor of claim 1, wherein the primary polymeric binder is present in particulate form.

4. The negative-working, infrared radiation-sensitive lithographic printing plate precursor of claim 1, wherein the primary polymeric binder is present and comprises recurring units comprising polyalkylene oxide segments and recurring units comprising pendant cyano groups.

5. A negative-working, infrared radiation-sensitive lithographic printing plate precursor that is on-press developable, comprising:
   a substrate having a hydrophilic surface, and
   an infrared radiation-sensitive imageable layer that is disposed on the hydrophilic surface of the substrate, and comprises:
     one or more free radically polymerizable compounds;
     one or more infrared radiation absorbers;
     an initiator composition that provides free radicals upon exposure of the infrared radiation-sensitive imageable layer to infrared radiation, the initiator composition comprising compound A and one or more compounds collectively as compound B; and
     optionally, a primary polymeric binder that is present in particulate form, wherein:
Compound A includes one of the following cations, and each cation is present with a tetraphenyl borate anion:

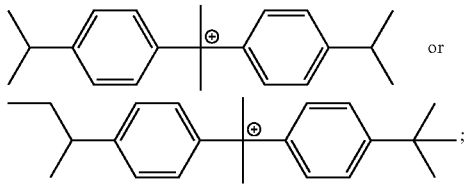

and Compound B includes one of the following cations or mixture thereof, and each cation is present with a tetraphenyl borate anion:

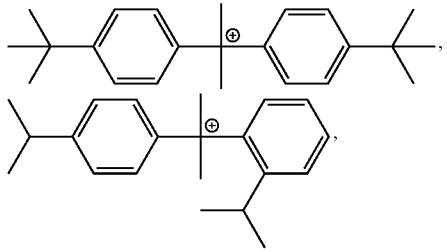

or a mixture of

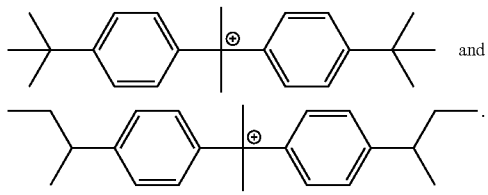

the molar ratio of compound A to compound B is from 20:80 to and including 80:20;
the sum of the weight of both compound A and compound B is at least 7 weight % and up to and including 15 weight %, based on the total dry weight of the infrared radiation-sensitive imageable layer; and
at least one infrared radiation absorber is a cyanine dye.

6. The negative-working, infrared radiation-sensitive lithographic printing plate precursor of claim 5, wherein the primary polymeric binder is present in particulate form and comprises recurring units comprising polyalkylene oxide segments and recurring units comprising pendant cyano groups.

7. A method for providing a lithographic printing plate, the method comprising in sequence:
imagewise exposing the negative-working, infrared radiation-sensitive lithographic printing plate precursor of claim 1 to infrared radiation to provide an exposed precursor comprising exposed regions and non-exposed regions in the infrared radiation-sensitive imageable layer,
mounting the exposed precursor onto a lithographic printing press, and
removing the infrared radiation-sensitive imageable layer in the non-exposed regions using a lithographic ink, fountain solution, or both a lithographic ink and a fountain solution to provide a lithographic printing plate.

8. The method of claim 7, wherein the negatively-working infrared radiation-sensitive lithographic printing plate precursor is defined by:
Compound A includes one of the following cations, and each cation is present with a tetraphenyl borate anion:

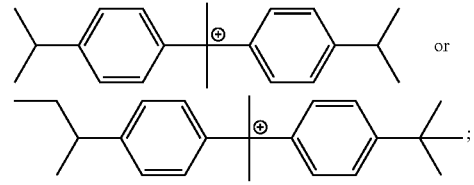

and Compound B includes one of the following cations or mixture thereof, and each cation is present with a tetraphenyl borate anion:

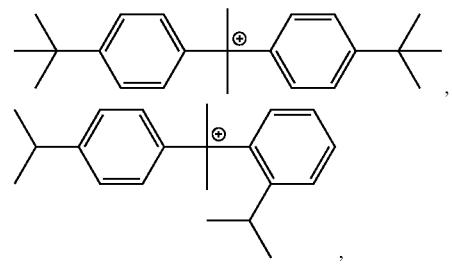

or a mixture of

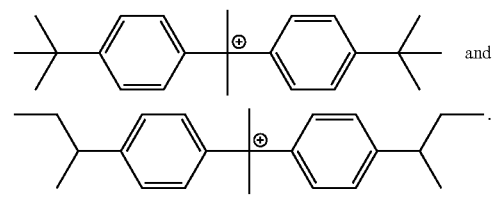

9. The method of claim 7, wherein the primary polymeric binder is present in particulate form in the infrared radiation-sensitive imageable layer, and the primary polymeric binder comprises recurring units comprising polyalkylene oxide segments and recurring units comprising pendant cyano groups.

* * * * *